(12) United States Patent
Choi et al.

(10) Patent No.: US 9,337,247 B2
(45) Date of Patent: May 10, 2016

(54) ORGANIC LIGHT-EMITTING DIODE DISPLAY WITH BOTTOM SHIELDS

(71) Applicant: Apple Inc., Cupertino, CA (US)

(72) Inventors: Jae Won Choi, Cupertino, CA (US); Jean-Pierre Guillou, San Francisco, CA (US); Shih Chang Chang, Cupertino, CA (US); Tsung-Ting Tsai, Taipei (TW); Vasudha Gupta, Cupertino, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/488,725

(22) Filed: Sep. 17, 2014

(65) Prior Publication Data

US 2015/0206931 A1 Jul. 23, 2015

Related U.S. Application Data

(60) Provisional application No. 61/929,907, filed on Jan. 21, 2014.

(51) Int. Cl.
*H01L 31/20* (2006.01)
*H01L 27/32* (2006.01)
*H01L 29/786* (2006.01)

(52) U.S. Cl.
CPC ........ *H01L 27/3272* (2013.01); *H01L 27/3262* (2013.01); *H01L 29/7869* (2013.01); *H01L29/78603* (2013.01); *H01L 29/78606* (2013.01); *H01L 29/78666* (2013.01); *H01L 29/78675* (2013.01); *H01L 2924/0002* (2013.01)

(58) Field of Classification Search
CPC ............ H01L 51/0067; H01L 51/0072; H01L 51/5044; H01L 51/506; H01L 51/5265; H01L 51/5268; H01L 51/5278; H01L 51/5068; H01L 51/5064; H01L 51/0085; H01L 51/0071; H01L 51/5218; H01L 51/0061; H01L 51/0052; H01L 51/5092; H01L 27/3272; H01L 27/3262; H01L 51/56; H01L 29/78603; H01L 29/78606; H01L 29/78666; H01L 29/78675; H01L 29/7869; H01L 23/5226
USPC ................. 257/12–13, 40, 43, 59, 72, 81, 84, 257/87–89, 98–100, 347–348, 433–434; 313/112, 501, 503, 506–507
See application file for complete search history.

(56) References Cited

U.S. PATENT DOCUMENTS

| 6,924,863 B2 | 8/2005 | Nishida et al. |
| 7,483,098 B2 | 1/2009 | Kurasawa |

(Continued)

FOREIGN PATENT DOCUMENTS

| KR | 10-2013-0130552 | 12/2013 |
| KR | 10-2014-0004887 | 1/2014 |
| WO | 2013-134072 | 9/2013 |

*Primary Examiner* — Dung Le
(74) *Attorney, Agent, or Firm* — Treyz Law Group, P.C.; Jason Tsai; Zachary D. Hadd

(57) ABSTRACT

A display may have an array of organic light-emitting diode display pixels. Each display pixel may have a light-emitting diode that emits light under control of a drive transistor. Each display pixel may also have control transistors for compensating and programming operations. The array of display pixels may have rows and columns. Row lines may be used to apply row control signals to rows of the display pixels. Column lines (data lines) may be used to apply display data and other signals to respective columns of display pixels. A bottom conductive shielding structure may be formed below each drive transistor. The bottom conductive shielding structure may serve to shield the drive transistor from any electric field generated from the adjacent row and column lines. The bottom conductive shielding structure may be electrically floating or coupled to a power supply line.

19 Claims, 8 Drawing Sheets

(56) References Cited

U.S. PATENT DOCUMENTS

| | | |
|---|---|---|
| 7,605,799 B2 | 10/2009 | Amundson et al. |
| 8,593,584 B2 | 11/2013 | Itoh et al. |
| 2006/0246360 A1* | 11/2006 | Hwang .............................. 430/5 |
| 2006/0250592 A1* | 11/2006 | Noguchi et al. ................ 355/53 |
| 2008/0067519 A1* | 3/2008 | Sakurai et al. .................. 257/72 |
| 2009/0101915 A1* | 4/2009 | Weng et al. ..................... 257/72 |
| 2010/0060815 A1 | 3/2010 | Yamada et al. |
| 2011/0241005 A1* | 10/2011 | Ro et al. .......................... 257/59 |
| 2012/0001169 A1* | 1/2012 | Yamazaki ....................... 257/43 |
| 2012/0126235 A1 | 5/2012 | Shih et al. |
| 2013/0229591 A1* | 9/2013 | Kong ............................. 349/46 |

* cited by examiner

ORGANIC LIGHT-EMITTING DIODE DISPLAY WITH BOTTOM SHIELDS

This application claims the benefit of provisional patent application No. 61/929,907, filed Jan. 21, 2014, which is hereby incorporated by reference herein in its entirety.

BACKGROUND

This relates generally to electronic devices with displays and, more particularly, to display driver circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

An organic light-emitting diode display pixel includes a drive thin-film transistor connected to a data line via an access thin-film transistor. The access transistor may have a gate terminal that receives a scan signal via a corresponding scan line. Image data on the date line can be loaded into the display pixel by asserting the scan signal to turn on the access transistor.

In conventional organic light-emitting diode display pixels, the scan line is formed relatively close to the drive transistor. In certain operating scenarios, the scan line may be biased in a way that a horizontal electric field may be created between the scan line and the channel region of the drive transistor. An electric field generated in this way can interfere with the operation of the drive thin-film transistor and therefore result in undesired color artifacts.

It would therefore be desirable to be able to provide improved displays such as improved organic light-emitting diode displays.

SUMMARY

An electronic device may include a display having an array of display pixels. The display pixels may be organic light-emitting diode display pixels. Each display pixel may have an organic light-emitting diode that emits light. A drive transistor in each display pixel may apply current to the organic light-emitting diode in that display pixel. The drive transistor may be characterized by a threshold voltage.

Each display pixel may have control transistors that are used in compensating the display pixels for variations in the threshold voltages. During compensation operations, a reference voltage may be provided to the display pixels. The control transistors may also be used in loading display data into the display pixels during programming operations and in controlling display pixel emission operations.

Each display pixel may be provided with conductive shielding structures formed directly below the drive transistors to prevent any horizontal electric field generated from biasing the control transistors from interfering with the operation of the drive transistors. The conductive shielding structures may only be formed below the drive transistors and not the control transistors.

The conductive shielding structures may be formed from transparent conductive material or opaque conductive material. The conductive shielding structures may be electrically floating or may be shorted to a common power supply line such as a common cathode electrode. In particular, the conductive shielding structures may be formed in at least one buffer layer interposed between the drive transistor and a transparent substrate over which the drive transistor is formed. Conductive shields formed in this way are therefore sometimes referred to as bottom shields.

DETAILED DESCRIPTION

Figure 1:
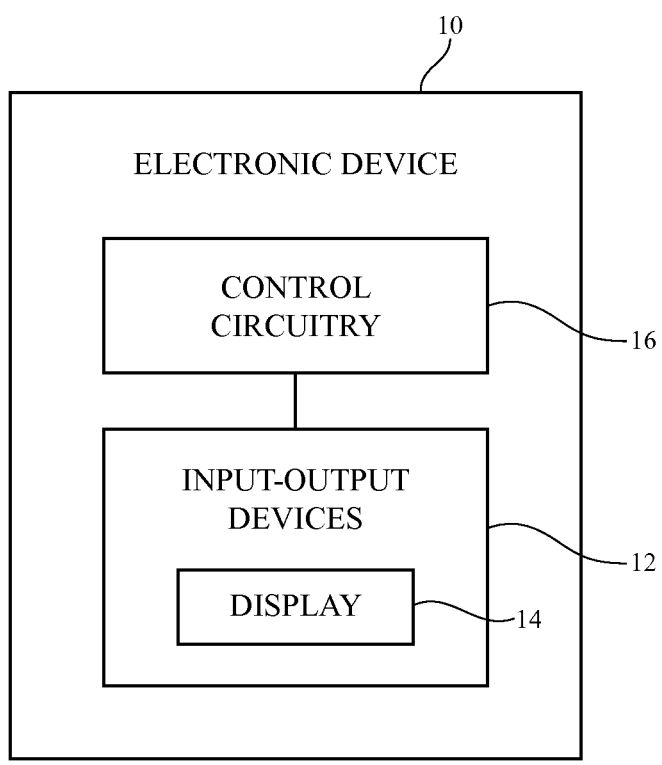
FIG. 1 is a diagram of an illustrative electronic device having a display in accordance with an embodiment.

An illustrative electronic device of the type that may be provided with an organic light-emitting diode (OLED) display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, programmable integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Figure 2:
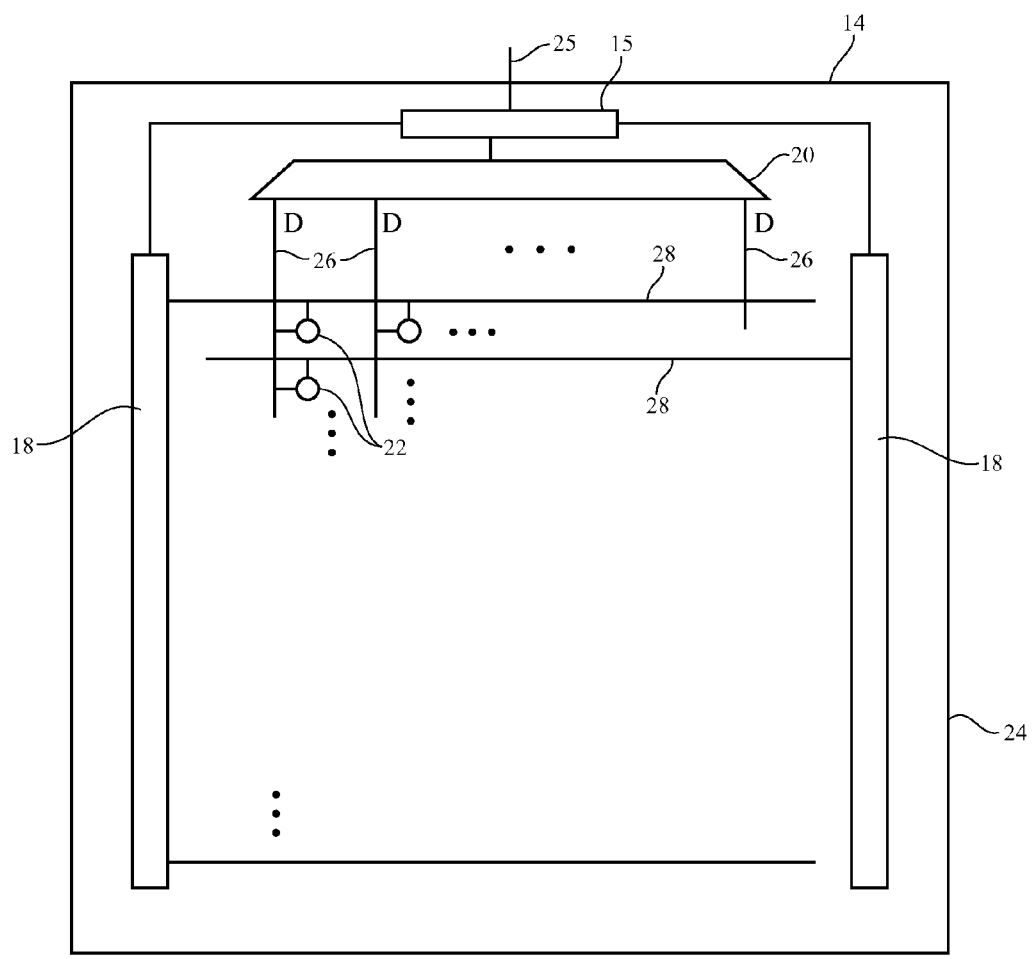
FIG. 2 is a diagram of an illustrative display such as an organic light-emitting diode display having an array of organic light-emitting diode display pixels in accordance with an embodiment.

FIG. 2 shows display 14 that includes structures formed on one or more layers such as substrate 24. Layers such as substrate 24 may be formed from planar rectangular layers of material such as planar glass layers. Display 14 may have an array of display pixels 22 for displaying images for a user. The array of display pixels 22 may be formed from rows and columns of display pixel structures on substrate 24. These structures may include thin-film transistors such as polysilicon thin-film transistors, semiconducting oxide thin-film transistors, etc. There may be any suitable number of rows and columns in the array of display pixels 22 (e.g., ten or more, one hundred or more, or one thousand or more).

Display driver circuitry such as display driver integrated circuit 15 may be coupled to conductive paths such as metal traces on substrate 24 using solder or conductive adhesive. Display driver integrated circuit 15 (sometimes referred to as a timing controller chip) may contain communications circuitry for communicating with system control circuitry 16 over path 25. Path 25 may be formed from traces on a flexible printed circuit or other cable. The control circuitry may be located on a main logic board in an electronic device such as a cellular telephone, computer, television, set-top box, media player, portable electronic device, or other electronic equipment in which display 14 is being used. During operation, the control circuitry may supply display driver integrated circuit 15 with information on images to be displayed on display 14. To display the images on display pixels 22, display driver integrated circuit 15 may supply clock signals and other control signals to display driver circuitry such as row driver circuitry 18 and column driver circuitry 20. Row driver circuitry 18 and/or column driver circuitry 20 may be formed from one or more integrated circuits and/or one or more thin-film transistor circuits.

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines or "scan" lines). Row driver circuitry may sometimes be referred to as scan line driver circuitry.

Column driver circuitry 20 may be used to provide data signals D from display driver integrated circuit 15 onto a plurality of corresponding vertical lines 26. Column driver circuitry 20 may sometimes be referred to as data line driver circuitry or source driver circuitry. Vertical lines 26 are sometimes referred to as data lines. During compensation operations, column driver circuitry 20 may use vertical lines 26 to supply a reference voltage. During programming operations, display data is loaded into display pixels 22 using lines 26.

Each data line 26 is associated with a respective column of display pixels 22. Sets of horizontal signal lines 28 run horizontally through display 14. Each set of horizontal signal lines 28 is associated with a respective row of display pixels 22. The number of horizontal signal lines in each row is determined by the number of transistors in the display pixels 22 that are being controlled independently by the horizontal signal lines. Display pixels of different configurations may be operated by different numbers of scan lines.

Row driver circuitry 18 may assert control signals such as scan signals on the row lines 28 in display 14. For example, driver circuitry 18 may receive clock signals and other control signals from display driver integrated circuit 15 and may, in response to the received signals, assert scan signals and an emission signal in each row of display pixels 22. Rows of display pixels 22 may be processed in sequence, with processing for each frame of image data starting at the top of the array of display pixels and ending at the bottom of the array (as an example). While the scan lines in a row are being asserted, control signals and data signals that are provided to column driver circuitry 20 by circuitry 16 direct circuitry 20 to demultiplex and drive associated data signals D onto data lines 26 so that the display pixels in the row will be programmed with the display data appearing on the data lines D. The display pixels can then display the loaded display data.

Figure 3:
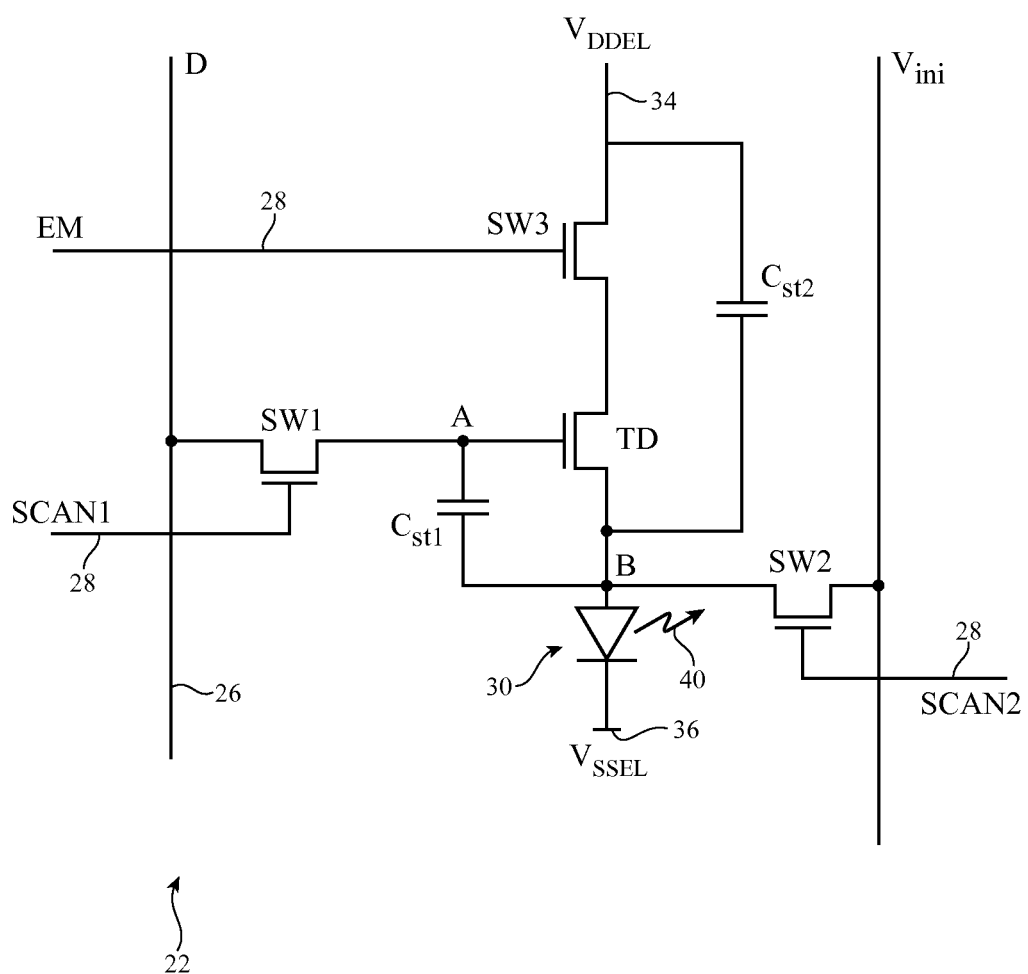
FIG. 3 is a diagram of an illustrative organic light-emitting diode display pixel of the type that may be used in a display in accordance with an embodiment.

In an organic light-emitting diode display, each display pixel contains a respective organic light-emitting diode. A schematic diagram of an illustrative organic light-emitting diode display pixel 22 is shown in FIG. 3. As shown in FIG. 3, display pixel 22 may include a light-emitting diode 30 coupled to a drive transistor TD. A positive power supply voltage $V_{DDEL}$ may be supplied to positive power supply terminal 34, whereas a ground power supply voltage $V_{SSEL}$ may be supplied to ground power supply terminal 36. The state of drive transistor TD controls the amount of current flowing through diode 30 and therefore the amount of emitted light 40 from display pixel 22.

Display pixel 22 may have storage capacitors Cst1 and Cst2 and one or more transistors that are used as switches such as transistors SW1, SW2, and SW3. Signal EM and scan signals SCAN1 and SCAN2 are provided to a row of display pixels 22 using row lines 28. Data D is provided to a column of display pixels 22 via data lines 26.

Signal EM is used to control the operation of emission transistor SW3. Transistor SW1 is used to apply the voltage of data line 26 to node A, which is connected to the gate of drive transistor TD. Transistor SW2 is used to apply a direct current (DC) bias voltage Vini to node B for circuit initialization during compensation operations.

During compensation operation, display pixels 22 are compensated for pixel-to-pixel variations such as transistor threshold voltage variations. The compensation period includes an initialization phase and a threshold voltage generation phase. Following compensation (i.e., after the compensation operations of the compensation period have been completed), data is loaded into the display pixels. The data loading process, which is sometimes referred to as data programming, takes place during a programming period. In a color display, programming may involve demultiplexing data and loading demultiplexed data into red, green, and blue pixels.

Following compensation and programming (i.e., after expiration of a compensation and programming period), the display pixels of the row may be used to emit light. The period of time during which the display pixels are being used to emit light (i.e., the time during which light-emitting diodes 30 emit light 40) is sometimes referred to as an emission period.

During the initialization phase, circuitry 18 asserts SCAN1 and SCAN2 (i.e., SCAN1 and SCAN2 are taken high). This turns on transistors SW1 and SW2 so that a reference voltage signal Vref and initialization voltage signal Vini are applied to nodes A and B, respectively. During the threshold voltage generation phase of the compensation period, signal EM is asserted and switch SW3 is turned on so that current flows through drive transistor TD to charge up the capacitance at node B. As the voltage at node B increases, the current through drive transistor TD will be reduced because the gate-source voltage Vgs of drive transistor TD will approach the threshold voltage Vt of drive transistor TD. The voltage at node B will therefore go to Vref−Vt.

After compensation (i.e., after initialization and threshold voltage generation), data is programmed into the compensated display pixels. During programming, emission transistor SW3 is turned off by deasserting signal EM and a desired data voltage D is applied to node A using data line 26. The voltage at node A after programming is display data voltage Vdata. The voltage at node B rises because of coupling with node A. In particular, the voltage at node B is taken to Vref−Vt+(Vdata−Vref)*K, where K is equal to Cst1/(Cst1+Cst2+Coled), where Coled is the capacitance associated with diode 30.

After compensation and programming operations have been completed, the display driver circuitry of display 14 places the compensated and programmed display pixels into the emission mode (i.e., the emission period is commenced). During emission, signal EM is asserted for each compensated and programmed display pixel to turn on transistor SW3. The voltage at node B goes to Voled, the voltage associated with diode 30. The voltage at node A goes to Vdata+Voled−(Vref−Vt)−(Vdata−Vref)*K. The value of Vgs−Vt for the drive transistor is equal to the difference between the voltage Va of node A and the voltage Vb of node B. The value of Va−Vb is (Vdata−Vref)*(1−K), which is independent of Vt. Accordingly, each display pixel 22 has been compensated for threshold voltage variations so that the amount of light 40 that is emitted by each of the display pixels 22 in the row is proportional only to the magnitude of the data signal D for each of those display pixels.

Figure 4:
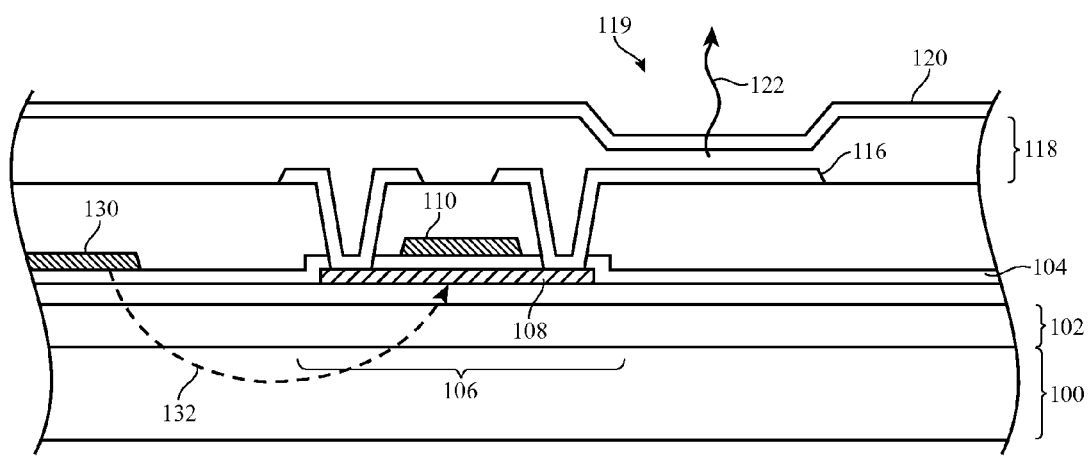
FIG. 4 is a cross-sectional side view of conventional organic light-emitting diode display pixel structures.

FIG. 4 is a cross-sectional side view of conventional OLED display pixel structures. As shown in FIG. 4, the pixel structures are formed on a clear polyimide (PI) substrate 100. Multiple buffer layers 102 are formed on the PI substrate 100. Polysilicon 108 is patterned on buffer layers 102 to form an active region for drive transistor 106. Gate insulating layer 104 is formed on buffer layers 102 over polysilicon 108. A metal gate conductor 110 is formed on gate insulating layer 104 and serves as the gate terminal for drive transistor 106. A metal path 130 that is formed adjacent to transistor 106 may serve as one of the scan lines for the display pixel. A silicon nitride passivation layer (not shown in FIG. 4) may be formed on gate insulating layer 104 over metal structures 110 and 130.

Thin-film drive transistor 106 formed in this way passes current between cathode 58 (i.e., an indium tin oxide electrode) and anode 116 (i.e., a metal layer) of light-emitting diode 119. As this current passes through organic light-emitting diode emissive electroluminescent layer (emissive layer) 118, light 122 is generated. Display pixels generating light 122 in this way is typically referred to as top emission display pixels.

During normal display operations, scan line 130 is sometimes biased to a negative voltage (i.e., scan line 130 can be biased to −5V). Assuming buffer layers 102 includes two buffer layers, a negative charge is induced at the top of the PI substrate 100. Negative charge induced in this way can undesirably decrease the amount of current flowing through drive transistor 106 (i.e., the electric field generated between scan line 130 and the channel of transistor 106, as indicated by line 132, can negatively impact the performance of transistor 106). It may therefore be desirable to form display pixels that are immune to this horizontal field effect.

Figure 5:
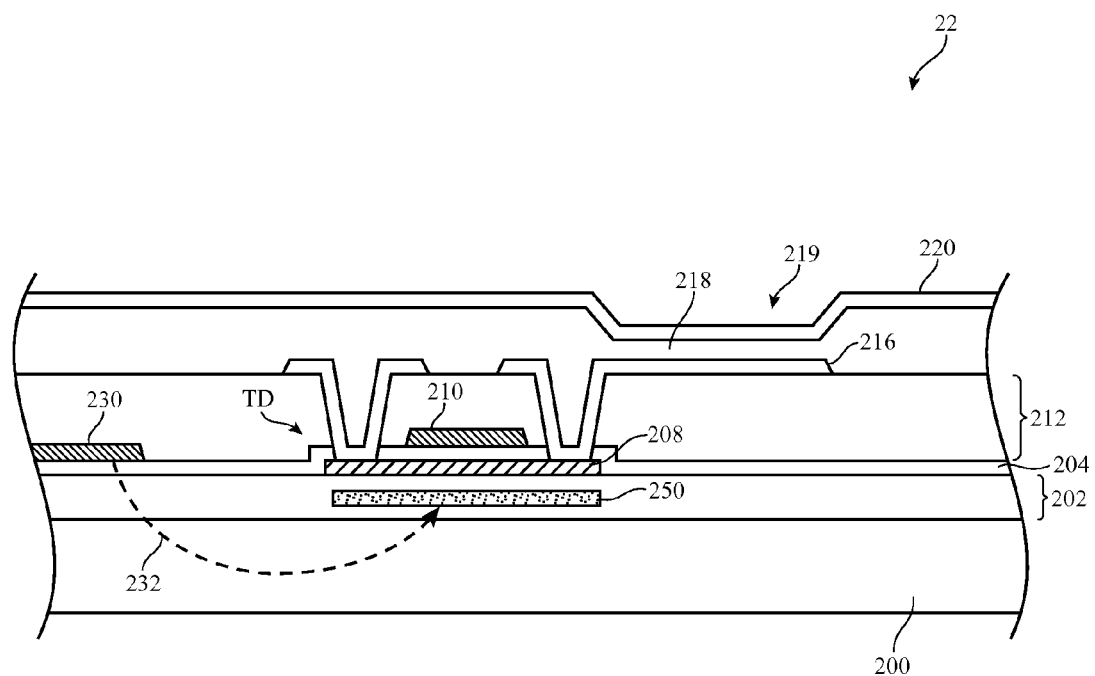
FIG. 5 is a cross-sectional side view of an illustrative organic light-emitting diode display pixel having a drive transistor and a conductive shielding structure formed directly below the drive transistor in accordance with an embodiment.

In accordance with an embodiment, a display pixel 22 having a bottom conductive shield is provided (see, e.g., FIG. 5). As shown in FIG. 5, thin-film transistor structures such as thin-film drive transistor TD may be formed on a transparent substrate 200 made from as glass, polyimide, or other transparent dielectric material. Thin-film transistor TD may serve as the display pixel drive transistor TD that is described in connection with FIG. 3.

One or more buffer layers such as buffer layers 306 may be formed on substrate 200. Buffer layers 306 may include layers sometimes referred to as a multi-buffer (MB) layer, an active oxide layer, and other layers formed from any suitable transparent dielectric material.

Active material 208 for transistor TD may be formed on buffer layers 202. Active material 208 may be a layer of polysilicon, indium gallium zinc oxide, amorphous silicon, or other semiconducting material. A gate insulating layer such as gate insulating layer 204 may be formed on buffer layers 202 and over the active material. Gate insulator 204 may be formed form a dielectric such as silicon oxide. A conductive gate structure such as gate conductor 210 may be disposed over gating insulator 204. Gate conductor 210 may serve as the gate terminal for thin-film transistor TD. The portion of active material 208 directly beneath gate 210 may serve as the channel region for transistor TD.

A conductive path such as path 230 may be formed in close proximity to transistor TD. Path 230 may, for example, be part of a control line for conveying one of the control/data signals to display pixel 22. In one arrangement, path 230 may be part of a scan line for carrying signal SCANT to corresponding switch SW1 in pixel 22 (FIG. 3). In another arrangement, path 230 may be part of a scan line for carrying signal SCAN2 to corresponding switch SW2 in pixel 22. In yet another arrangement, path 230 may be part of a control line for carrying signal EM to corresponding switch SW3 in pixel 22.

A passivation layer such as a silicon nitride layer (not shown in FIG. 5) may optionally be formed on gate insulating layer 204 and over gate 210. After deposition of the passivation layer, a hydrogenation annealing process may be applied to passivate the thin-film transistor structures.

One or more dielectric layers 212 (sometimes referred to as interlayer dielectric or "ILD" layers) may be formed over the thin-film transistor structures. The material with which gate 210 and path 230 is formed is sometimes referred to as "M1" metal. The dielectric layer in which the M1 metal is formed may therefore be referred to as an M1 metal routing layer.

Thin-film transistor structures such as thin-film transistor TD may pass current between cathode 220 (e.g., a transparent conductive layer such as indium tin oxide or indium zinc oxide) and anode 216 (e.g., a light reflecting metal layer) of light-emitting diode 219. As this current passes through organic light-emitting diode emissive electroluminescent layer (emissive layer) 218, light may be generated. Light generated in this way may pass through a corresponding color filter element (not shown), which imparts a desired color to the emitted light. In general, either top or bottom emission display pixel configurations can be implemented for display 14.

As described above, electric field can sometimes be generated between transistor TD and an adjacent control path such as path 230, as indicated by dotted field line 232. In accordance with an embodiment of the present invention, a conductive shielding structure such as shield 250 may be formed directly beneath drive transistor TD within buffer layers 202. Shield 250 should not be in direct contact with active material 208 and gate insulating layer 204. Shielding structure 250 may be formed from transparent conductive materials such as indium tin oxide, molybdenum, and molybdenum tungsten or opaque conductive materials such as titanium, copper, aluminum, or other metals. Formed in this way, conductive bottom shield 250 may serve to block any horizontal field generated from metal path 230 or any other adjacent control lines for transistor TD (e.g., shield 250 may prevent any undesired horizontal electric fields from negatively impacting the operation of transistor TD). Shield 250 formed below transistor TD in this way is therefore sometimes referred to as a "bottom" shield or an electric field shield.

In general, it may only be desirable to form bottom conductive shields directly below the drive transistors in each pixel. In other words, bottom conductive shields need not be formed for the peripheral switching transistors SW1, SW2, and SW3 (FIG. 3). Forming shield 250 only under drive thin-film transistor TD can help reduce any undesired parasitic capacitance within pixel 22, thereby minimizing dynamic power consumption.

Figure 6:
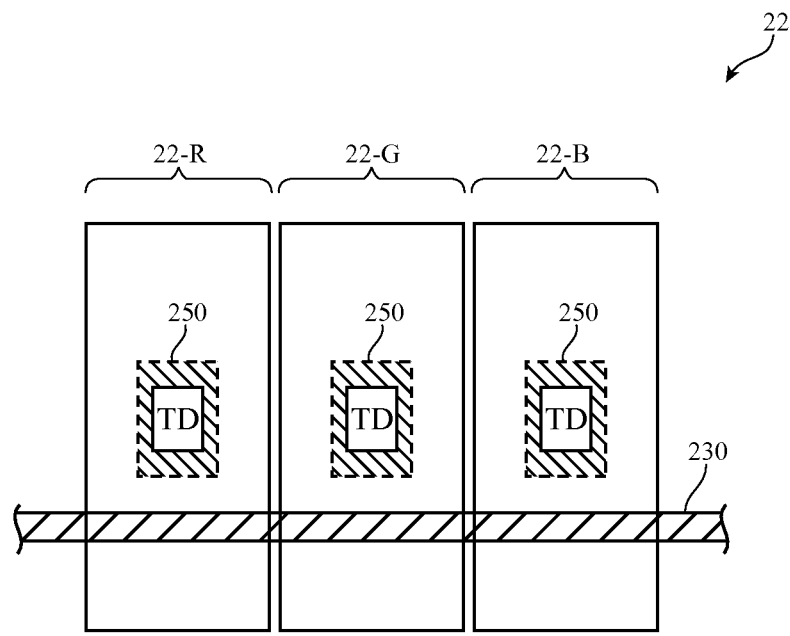
FIG. 6 is a top view of multiple display pixels of the type shown in FIG. 5 having conductive shielding structures that are electrically floating in accordance with an embodiment.

The structures of FIG. 5 form a single subpixel of a particular color. There may be three or four subpixels per display pixel 22 or other suitable number of subpixels per display pixel 22 in display 14. FIG. 6 is a diagram of an exemplary display pixel 22 having three subpixels 22-R, 22-G, and 22-B. Subpixel 22-R may include circuitry for displaying red light (e.g., subpixel 22-R may include a light-emitting diode that emits light through a red color filter element). Subpixel 22-G may include circuitry for displaying green light (e.g., subpixel 22-G may include a light-emitting diode that emits light through a green color filter element). Subpixel 22-B may include circuitry for displaying blue light (e.g., subpixel 22-B may include a light-emitting diode that emits light through a blue color filter element). This is merely illustrative. In general, display pixel 22 may include any number of subpixels configured to transmit red light, green light, blue light, cyan light, magenta light, yellow light, white light, and/or other types of light in the visible spectrum.

As shown in FIG. 6, each of the subpixels includes a drive transistor TD and a respective conductive light shield 250 that directly overlaps with the footprint of drive transistor TD. Configured in this way, light shield structures 250 serve to prevent any electric field generated as a result of bias voltages applied on control path 230 from interfering with the operation of the drive transistors. The example of FIG. 6 in which bottom shields 250 are electrically floating (i.e., shields 250 are not actively driven by any pull-up or pull-down circuits and are not connected to one another) is merely illustrative. In other suitable arrangements, bottom shields 250 may be shorted using conductive shorting path 252 (see, e.g., FIG. 7).

Figure 7:
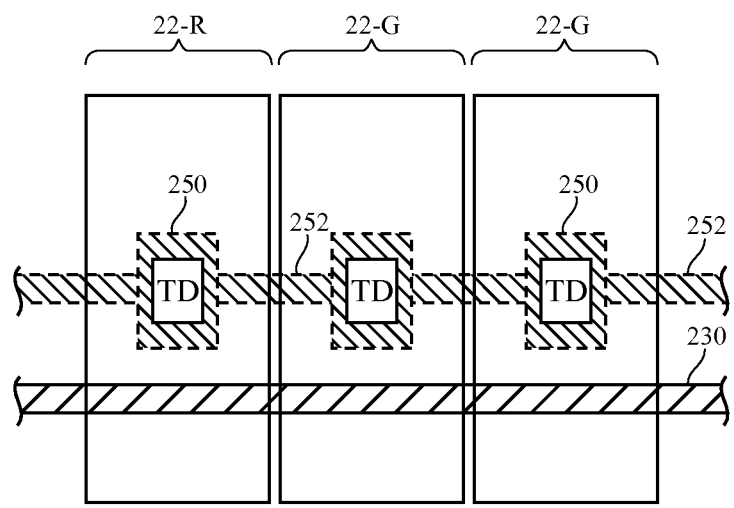
FIG. 7 is a top view of multiple display pixels of the type shown in FIG. 5 having conductive shielding structures that are shorted to one another in accordance with an embodiment.

As shown in FIG. 7, conductive shorting path 252 may be formed in the same layer as conductive shields 250 (e.g., conductive shorting path 252 may be formed in buffer layers 202 of FIG. 5). Conductive shorting path 252 may also be formed from the same material as that of shields 250 (e.g., shorting path 252 may be formed from transparent conductive materials such as indium tin oxide, molybdenum, and molybdenum tungsten or opaque conductive materials such as titanium, copper, aluminum, or other metals). Shorting the bottom shields together via conductive path 252 can provide improved shielding capabilities, especially when paths 252 are shorted to some power supply line.

Figure 8:
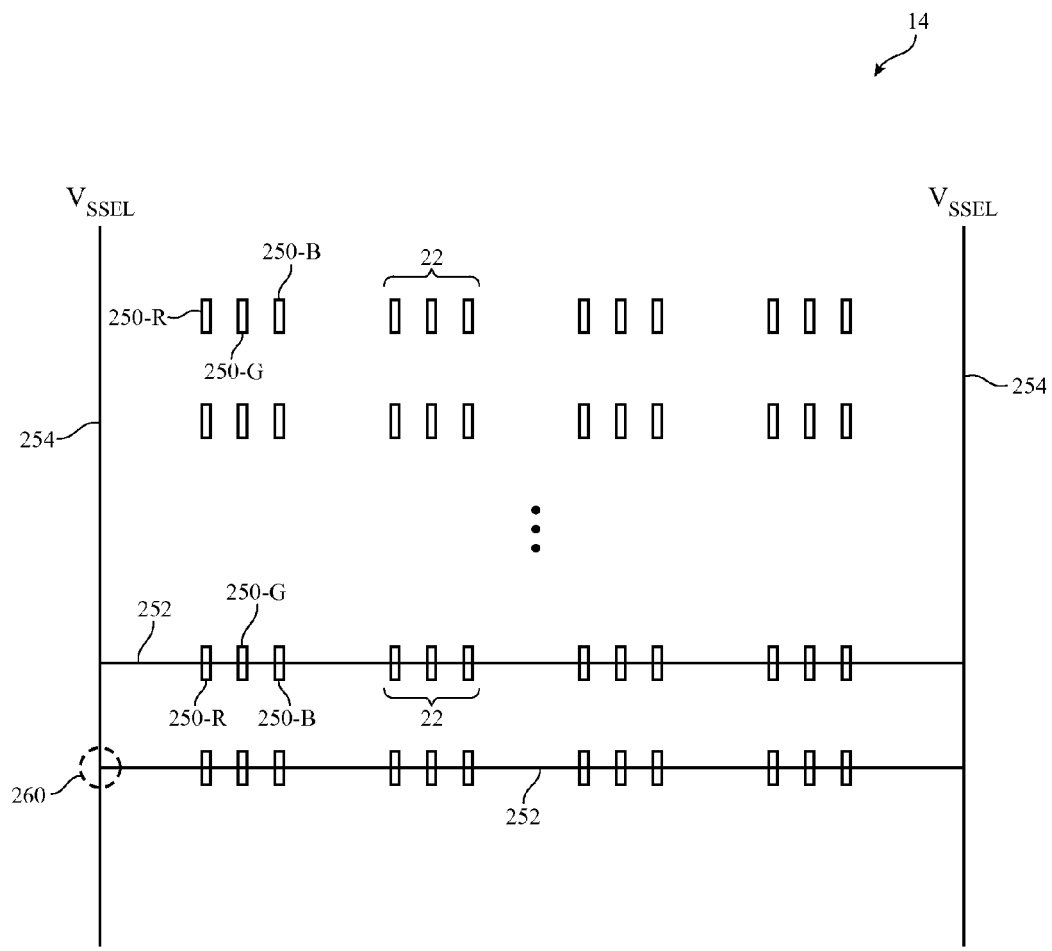
FIG. 8 is a diagram showing how at least some conductive shielding structures in a display pixel array may be shorted to a common cathode electrode in accordance with an embodiment.

FIG. 8 is a diagram showing an array of pixels 22 in display 14. As shown in FIG. 8, at least a portion of bottom shields 250 (e.g., conductive shields 250-R, 250-G, and 250-B) can be shorted to a power supply line 254 (e.g., a power supply line on which ground power supply voltage $V_{SSEL}$ is provided) via path 252. Bottom shield shorting paths 252 may be coupled to ground line 254 only at the periphery of display 14. Connected in this way, the bottom shield in each display subpixel is driven to a constant voltage $V_{SSEL}$, which enables the drive transistor to operate in a more consistent manner across the entire display pixel array.

Still referring to FIG. 8, the bottom shields in at least some display pixels 22 are floating and are not connected to power supply line 254. This is merely illustrative. As another example, the conductive shields 250 of each subpixel in the entire pixel array may be electrically floating. As yet another example, the conductive shields 250 of each subpixel in the entire pixel array may all be shorted to a ground power supply line, a positive power supply line, or other power supply lines.

As described above in connection with FIG. 5, bottom shielding structure 250 may be formed in buffer layers 202. In the arrangement in which bottom shielding structure 250 is shorted to a ground line (e.g., a common cathode electrode), the bottom shielding structure can be coupled to the cathode through conductive through-hole or "via" structures formed through the thin-film transistor layers.

Figure 9:
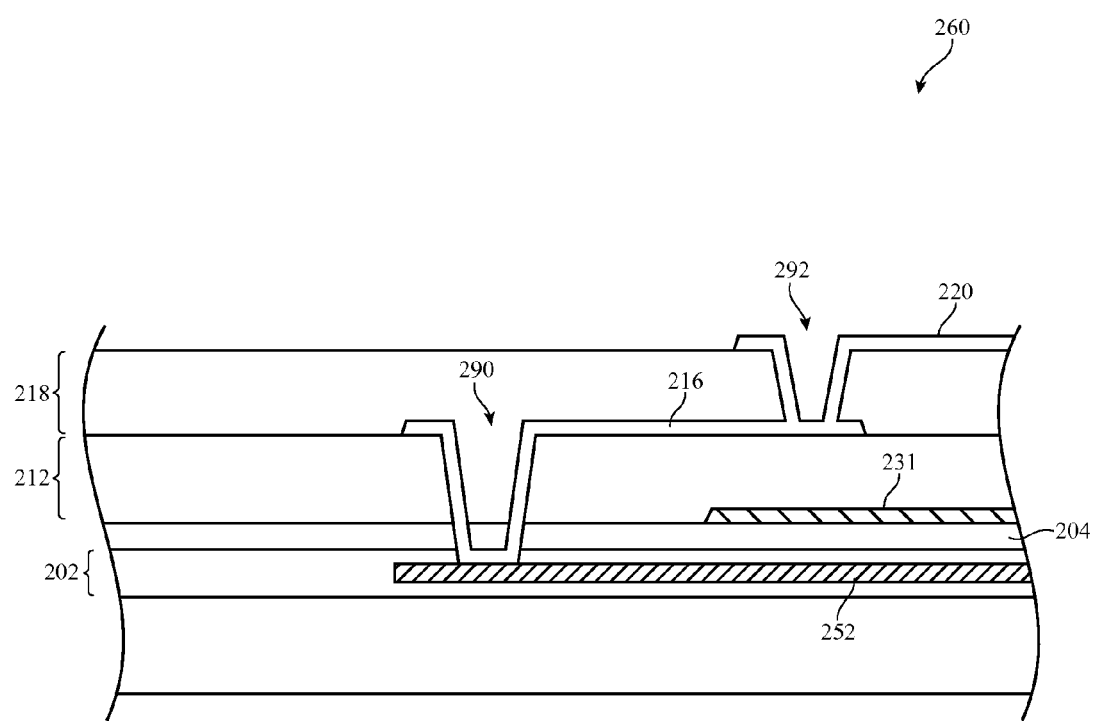
FIG. 9 is a cross-sectional side view of a peripheral portion of the display pixel array of FIG. 9 showing how the conductive shielding structures can be connected to the cathode electrode using vias in accordance with an embodiment.

A cross-sectional side view of a peripheral portion 260 of display 14 showing how the bottom shielding structure can be shorted to the cathode electrode is illustrated in FIG. 9. As shown in FIG. 9, conductive shorting path 252 is formed in buffer layers 202 and may extend into the periphery of display 14. One or more M1 metal routing paths such as metal structure 231 may be formed on gate insulating layer 204. A first via structure 290 may be formed through layers 212 and 204 to form a contact with bottom conductive path 252. In particular, via 290 may establish an electrical connection between path 252 and anode 216. A second via structure 292 may be formed through layer 218 to form a contact with anode 216. In particular, via 282 may serve to establish an electrical connection between anode 216 and cathode 220. Configured in this way, bottom shielding structures 250 of the type shown in FIGS. 5, 7, and 8 may be shorted to the grounding cathode electrode through conductive path(s) 252 and vias 290 and 292.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   a thin-film transistor formed over the substrate;
   at least one buffer layer interposed between the thin-film transistor and the substrate; and
   a conductive shielding structure formed in the buffer layer directly below the thin-film transistor, wherein the conductive shielding structure is formed from transparent conductive material.

2. The display defined in claim 1, wherein the conductive shielding structure is electrically floating.

3. The display defined in claim 1, further comprising:
   a power supply line, wherein the conductive shielding structure is shorted to the power supply line.

4. The display defined in claim 1, further comprising:
a cathode electrode shorted to the conductive shielding structure through vias.

5. The display defined in claim 1, wherein the thin-film transistor has a gate formed on a gate insulating layer, and wherein the conductive shielding structure is not in direct contact with the gate insulating layer.

6. The display defined in claim 1, further comprising:
additional thin-film transistors, wherein the conductive shielding structure is only formed below the thin-film transistor but not below the additional thin-film transistors.

7. A method of manufacturing a display pixel, comprising:
forming a thin-film transistor over a substrate;
forming a buffer layer interposed between the thin-film transistor and the substrate, wherein the buffer layer has first and second opposing surfaces; and
forming an electric field shield in the buffer layer for the thin-film transistor, wherein the electric field shield is interposed between the first and second opposing surfaces of the buffer layer.

8. The method defined in claim 7, wherein forming the electric field shield comprises forming a conductive shielding structure directly below the thin-film transistor.

9. The method defined in claim 7, further comprising:
forming a light-emitting diode that is coupled to the thin-film transistor.

10. The method defined in claim 9, wherein the light-emitting diode has a cathode electrode, the method further comprising:
shorting the electric field shield to the cathode electrode through conductive via structures.

11. The method defined in claim 7, wherein the electric field shield is not actively driven.

12. The method defined in claim 7, further comprising:
forming an additional thin-film transistor over the substrate; and
forming an additional electric field shield in the buffer layer for the additional thin-film transistor.

13. The method defined in claim 12, further comprising:
forming a conductive path in the buffer layer that shorts the electric field shield and the additional electric field shield.

14. An electronic device display, comprising:
display pixels arranged in an array, wherein each display pixel in the array comprises:
a drive transistor; and
a conductive shield formed below the drive transistor; and
a conductive path that conveys signals to the display pixels, wherein the conductive shield blocks the drive transistor from electric fields generated by the conductive path in at least one of the display pixels in the array.

15. The electronic device display defined in claim 14, where each display pixel in the array further comprises a light-emitting diode coupled to the drive transistor.

16. The electronic device display defined in claim 15, wherein the conductive shield in each display pixel in the array is electrically floating.

17. The electronic device display defined in claim 15, wherein the conductive shield in each display pixel in the array is shorted to a common electrode.

18. The electronic device display defined in claim 15, wherein the conductive shield in each display pixel in a first portion of the array is electrically floating, and wherein the conductive shield in each display pixel in a second portion of the array is shorted to a common electrode.

19. The method defined in claim 7, wherein forming the buffer layer comprises forming a first buffer layer and a second buffer layer, and wherein forming the electric field shield comprises forming the electric field shield between the first and second buffer layers.

* * * * *